United States Patent
Rotondaro et al.

(10) Patent No.: US 7,691,714 B2
(45) Date of Patent: Apr. 6, 2010

(54) SEMICONDUCTOR DEVICE HAVING A DISLOCATION LOOP LOCATED WITHIN A BOUNDARY CREATED BY SOURCE/DRAIN REGIONS AND A METHOD OF MANUFACTURE THEREFOR

(75) Inventors: Antonio Luis Pacheco Rotondaro, Dallas, TX (US); Kaiping Liu, Plano, TX (US); Jihong Chen, Plano, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/042,415

(22) Filed: Jan. 25, 2005

(65) Prior Publication Data
US 2006/0163651 A1 Jul. 27, 2006

(51) Int. Cl.
*H01L 21/336* (2006.01)
*H01L 21/337* (2006.01)
(52) U.S. Cl. .................. 438/306; 438/197; 438/301

(58) Field of Classification Search ......... 438/197–203, 438/286–290, 300–307; 257/408, E21.135, 257/E21.248
See application file for complete search history.

(56) References Cited

U.S. PATENT DOCUMENTS

| 5,811,338 | A * | 9/1998 | Kao et al. ................... 438/286 |
| 6,495,887 | B1 * | 12/2002 | Krishnan et al. ............ 257/408 |
| 2004/0101999 | A1 * | 5/2004 | Oda et al. ................... 438/197 |

\* cited by examiner

*Primary Examiner*—Cuong Q Nguyen
(74) *Attorney, Agent, or Firm*—Warren L. Franz; Wade J. Brady, III; Frederick J. Telecky, Jr.

(57) ABSTRACT

The present invention provides a method for manufacturing a transistor device, a method for manufacturing an integrated circuit, and a transistor device. The method for manufacturing the transistor device, among other steps, includes forming a gate structure over a substrate and forming source/drain regions in the substrate proximate the gate structure, the source/drain regions having a boundary that forms an electrical junction with the substrate. The method further includes forming dislocation loops in the substrate, the dislocation loops not extending outside the boundary of the source/drain regions.

14 Claims, 5 Drawing Sheets

SEMICONDUCTOR DEVICE HAVING A DISLOCATION LOOP LOCATED WITHIN A BOUNDARY CREATED BY SOURCE/DRAIN REGIONS AND A METHOD OF MANUFACTURE THEREFOR

TECHNICAL FIELD OF THE INVENTION

The present invention is directed, in general, to a semiconductor device and, more specifically, to a semiconductor device having a dislocation loop located within a boundary created by source/drain regions and a method of manufacture therefore.

BACKGROUND OF THE INVENTION

An important aim of ongoing research in the semiconductor industry is increasing semiconductor performance while decreasing the size of semiconductor devices. One known step the industry has taken to attain this increased semiconductor performance is to implement strained silicon technology. Fortunately, strained silicon technology allows for the formation of higher speed devices. For example, as the electrons in the strained silicon experience less resistance and flow up to 80% faster than in unstrained silicon, the introduction of the strained silicon layer allows for the formation of higher speed devices.

Strained-silicon transistors may be created a number of different ways. In one instance strained layers are created by forming a layer of silicon germanium (SiGe) over or below a silicon epitaxial layer. The average distance between atoms in the SiGe crystal lattice is greater than the average distance between atoms in an ordinary silicon lattice. Because there is a natural tendency of atoms inside different crystals to align with one another when a second crystal is formed over a first crystal, when silicon is deposited on top of SiGe, or vice-versa, the silicon crystal lattice tends to stretch or "strain" to align the silicon atoms with the atoms in the SiGe layer. Unfortunately, the use of the SiGe layer is difficult and costly to implement.

In another instance, strained layers are created by a layer of dislocation loops. The insertion of an extra plane of atoms (a dislocation loop) in an ordinary silicon lattice creates stress in the surrounding silicon lattice. Currently, the layer of dislocation loops are introduced by implanting a dopant species into the substrate, thereby creating the strain. Currently, these dislocation loops are positioned below the channel region of the device or below the source/drain regions of the device to introduce the required strain. It is believed that the dislocation loops are currently placed deep below the channel region or source/drain regions so as not to interfere with channel mobility and source/drain junctions, respectively. Unfortunately, the placement of the dislocation loops makes it difficult to achieve the requisite amount of strain.

In another instance, a strained layer may be formed on the gate structure to generate strain in the channel region. Unfortunately, limitations on the strained layer thickness limits the amount of strain that can be introduced into the channel region.

Accordingly, what is needed in the art is a semiconductor device and method of manufacture therefore that experiences the benefits of a strained silicon layer without experiencing the aforementioned drawbacks.

SUMMARY OF THE INVENTION

To address the above-discussed deficiencies of the prior art, the present invention provides a method for manufacturing a transistor device, a method for manufacturing an integrated circuit, and a transistor device. The method for manufacturing the transistor device, among other steps, includes forming a gate structure over a substrate and forming source/drain regions in the substrate proximate the gate structure, the source/drain regions having a boundary that forms an electrical junction with the substrate. The method further includes forming dislocation loops in the substrate, the dislocation loops not extending outside the boundary of the source/drain regions.

As previously mentioned, the present invention also provides a method for manufacturing an integrated circuit. In addition to that provided in the method for manufacturing the transistor device, the method for manufacturing the integrated circuit includes forming interconnects within dielectric layers located over the transistor devices to form an operational integrated circuit. The transistor device, on the other hand and without limiation, includes: 1) a gate structure located over a substrate, 2) source/drain regions located in the substrate proximate the gate structure, the source/drain regions having a boundary that forms an electrical junction with the substrate, and 3) dislocation loops formed within the boundary of the source/drain regions.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
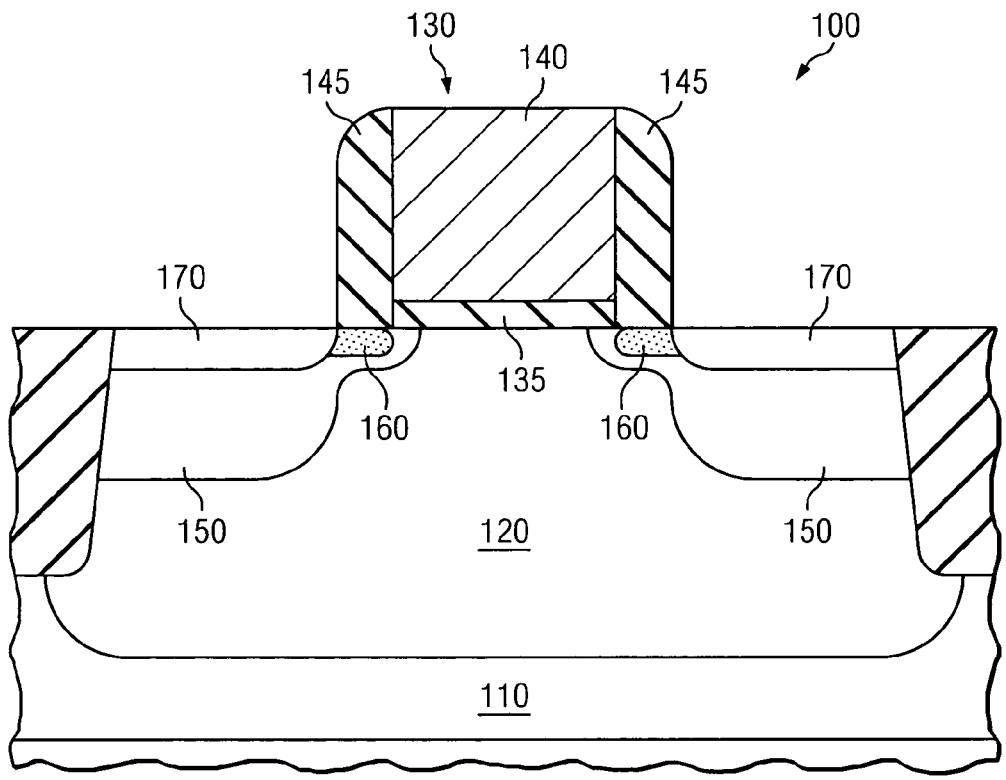
FIG. 1 illustrates a cross-sectional view of one embodiment of a transistor device constructed according to the principles of the present invention.

Referring initially to FIG. 1, illustrated is a cross-sectional view of one embodiment of a transistor device 100 constructed according to the principles of the present invention. In the embodiment illustrated in FIG. 1, the transistor device 100 includes a substrate 110. Located within the substrate 110 in the embodiment of FIG. 1 is a well region 120. Additionally, located over the substrate 110 and well region 120 is a gate structure 130.

The gate structure 130 illustrated in FIG. 1 includes a gate oxide 135 located over the substrate 110, as well as a polysilicon gate electrode 140 located over the gate oxide 135. Flanking both sides of the polysilicon gate electrode 140 and gate oxide 135 are gate sidewall spacers 145. Each of the features of the gate structure 130 are conventional.

The transistor device 100 illustrated in FIG. 1 further includes conventional source/drain regions 150 located within the substrate 110. The source/drain regions 150, as is common, each include extension implants, such as lightly doped source/drain extension implants, as well as a source/drain implants, such as heavily doped source/drain implants. As is shown in FIG. 1, the source/drain regions 150 have a boundary that forms an electrical junction with the substrate 110.

Uniquely formed in the substrate 110 are dislocation loops 160. The dislocation loops 160, as required by the present invention, are located within the source/drain regions 150 and do not extend outside the boundary of the source/drain regions 150. In an advantageous embodiment of the present invention, the dislocation loops 160 have a depth into the substrate 110 that is less than a depth of the source/drain regions 150 into the substrate 110. For example, in one exemplary embodiment the dislocation loops 160 have a depth into the substrate that is substantially similar to a depth of a channel region formed between the source/drain regions 150.

The transistor device 100 illustrated in FIG. 1 further includes conventional source/drain contacts 170. While the source/drain contacts 170 of FIG. 1 are silicided regions, any known or hereafter discovered source/drain contacts are within the scope of the present invention.

The use of the dislocation loops 160 in accordance with the principles of the present invention provide various advantages not experienced in the prior art devices. For example, the inclusion of the dislocation loops 160 within the boundaries of the source/drain regions 150 allows the dislocation loops 160, and thus the strain created therefrom, to be nearer to the channel region of the transistor device 100 than is attainable by the prior art methods. For example, the prior art structures positioned their dislocation loops well below the channel region to not interfere with the lattice structure of the channel region or well below the source/drain regions to not interfere with the electrical junctions of the source/drain regions. These devices, however, were incapable of providing the requisite amount of strain required for today's transistor devices. Moreover, they were time consuming and costly to manufacture. The present invention, on the other hand, is capable of placing the dislocation loops 160 nearer the channel region. Thus, the present invention may produce higher speed devices than the prior art.

Figure 2:
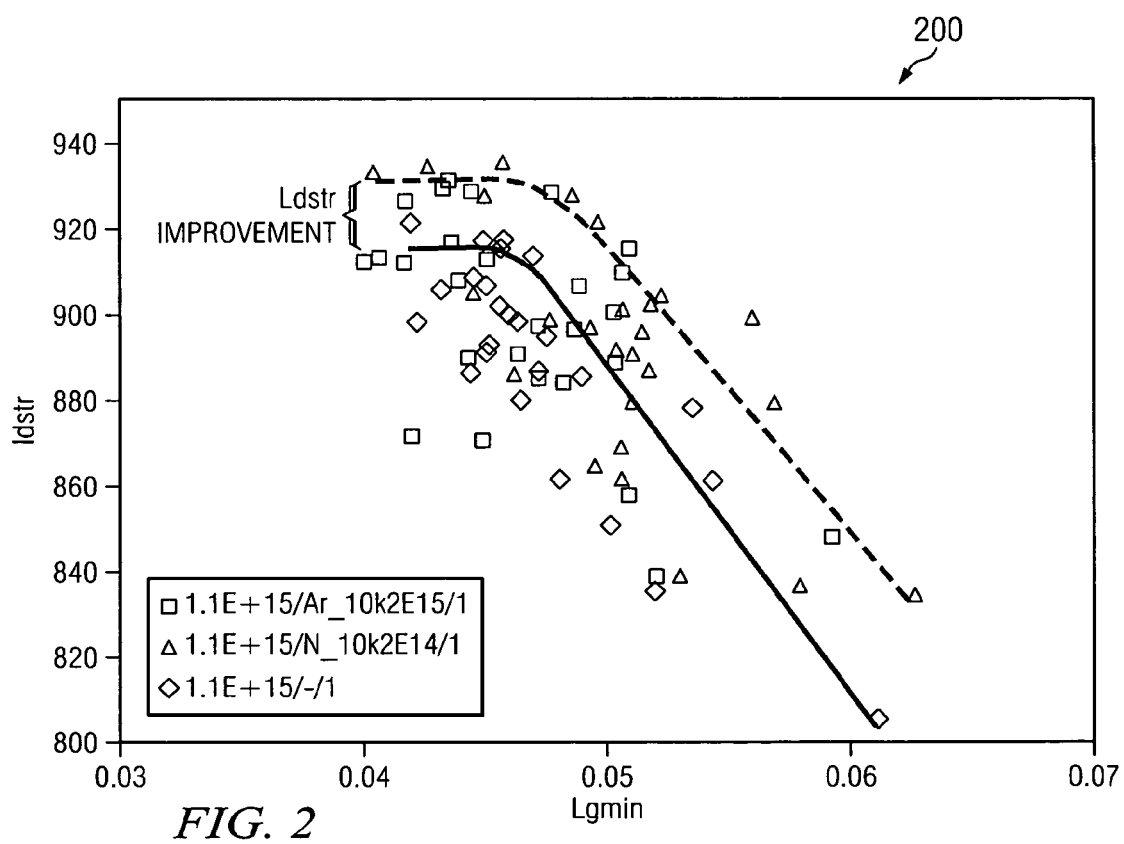
FIG. 2 illustrates a graph comparing drive current versus minimum gate length for devices without the dislocation loops in accordance with the present invention, and two different scenarios of devices with dislocation loops in accordance with the present invention.

Turning briefly to FIG. 2, illustrated is a graph 200 comparing drive current versus minimum gate length for devices without the dislocation loops manufactured in accordance with the present invention, and two different scenarios of devices with dislocation loops manufactured in accordance with the present invention. The device without the dislocation loops is depicted with the diamonds and shows a much lower drive current. In contrast, a device with the dislocation loops that were formed using a nitrogen implant are represented by the triangles and a device with the dislocation loops that were formed using an argon implant are represented by the squares. Both the nitrogen and argon embodiments exhibit a higher drive current than attained by the prior art device.

Figure 3:
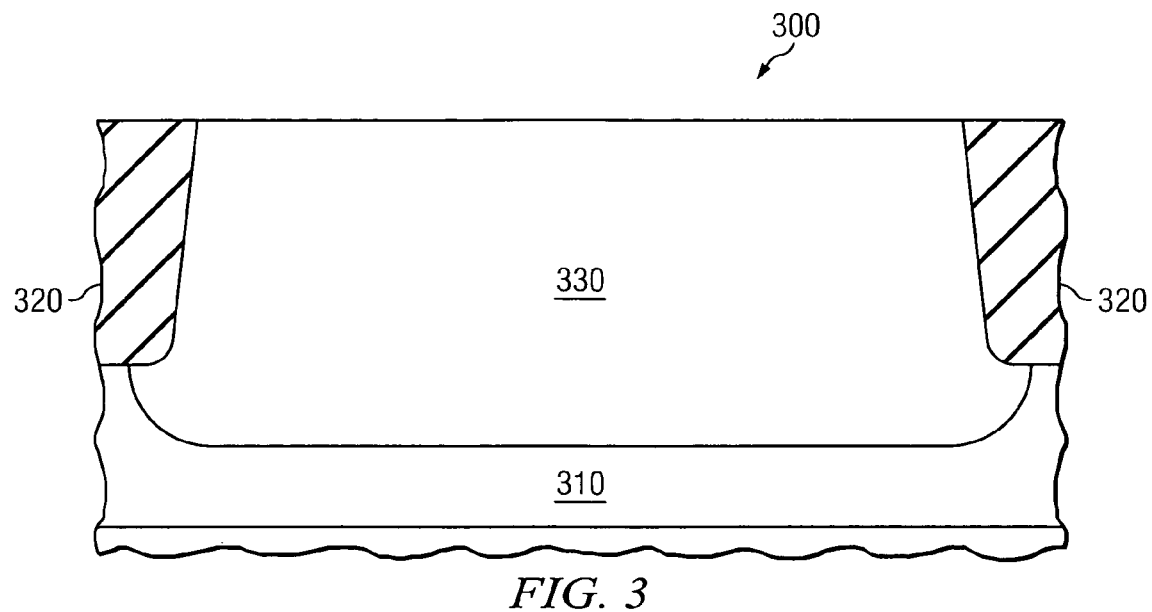
FIG. 3 illustrates a cross-sectional view of a partially completed transistor device.

Turning now to FIGS. 3-8, illustrated are cross-sectional views of detailed manufacturing steps instructing how one might, in an advantageous embodiment, manufacture a transistor device similar to the transistor device 100 depicted in FIG. 1. FIG. 3 illustrates a cross-sectional view of a partially completed transistor device 300. The partially completed transistor device 300 of FIG. 3 includes a substrate 310. The substrate 310 may, in an exemplary embodiment, be any layer located in the partially completed transistor device 300, including a wafer itself or a layer located above the wafer (e.g., epitaxial layer). In the embodiment illustrated in FIG. 3, the substrate 310 is a p-type semiconductor substrate; however, one skilled in the art understands that the substrate 310 could be an n-type substrate without departing from the scope of the present invention. In such a case, each of the dopant types described throughout the remainder of this document might be reversed. For clarity, no further reference to this opposite scheme will be discussed.

Located within the substrate 310 in the embodiment shown in FIG. 3 are shallow trench isolation regions 320. The shallow trench isolation regions 320 isolate the transistor device 300 from other devices located proximate thereto. As those skilled in the art understand the various steps used to form these conventional shallow trench isolation regions 320, no further detail will be given.

In the illustrative embodiment of FIG. 3, also formed within the substrate 310 is a well region 330. The well region 330 in the embodiment shown and discussed with respect to FIGS. 3-8 contains a p-type dopant, thus making the transistor an n-type metal oxide semiconductor (NMOS) device. For example, the well region 330 would likely be doped with a p-type dopant dose ranging from about 1E13 atoms/cm$^2$ to about 1E14 atoms/cm$^2$ and at a power ranging from about 100 keV to about 500 keV. What generally results is the well region 330 having a peak dopant concentration ranging from about 5E17 atoms/cm$^3$ to about 1E19 atoms/cm$^3$. It goes without saying that the well region 330 could contain an n-type dopant, thus making the transistor a PMOS device, without departing from the scope of the present invention. Nevertheless, for consistency the remainder of the document will be discussed as an NMOS device.

Figure 4:
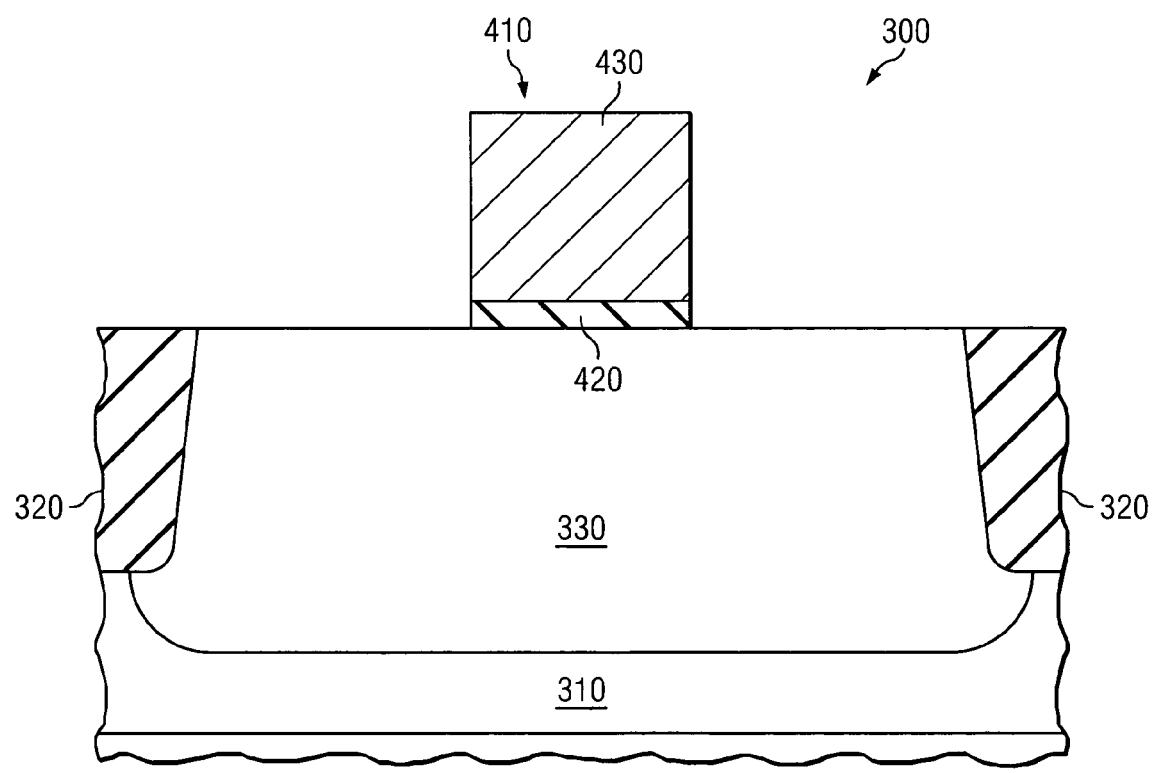
FIG. 4 illustrates a cross-sectional view of the partially completed transistor device illustrated in FIG. 3 after formation of a conventional gate structure over the substrate.

Turning now to FIG. 4, illustrated is a cross-sectional view of the partially completed transistor device 300 illustrated in FIG. 3 after formation of a conventional gate structure 410 over the substrate 310. As is illustrated in FIG. 4, the gate structure 410 includes a gate oxide 420 and a polysilicon gate electrode 430. As the gate structure 410 is conventional, those skilled in the art understand the standard steps used for its manufacture, including blanket depositing both a gate oxide layer and a polysilicon gate electrode layer and subsequently using photolithography to define the gate structure 410. The gate oxide 420, among others, may comprise a high-k dielectric and/or the gate electrode 430, among others, may comprise a metal gate material, without departing from the scope of the present invention.

Figure 5:
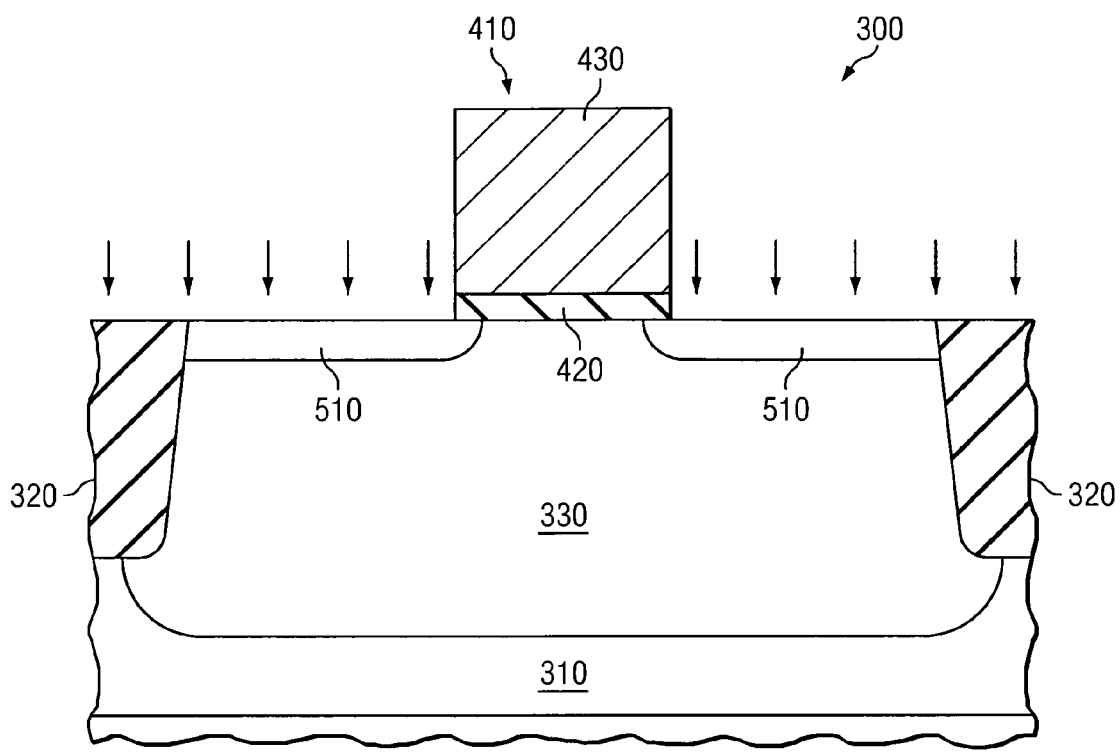
FIG. 5 illustrates a cross-sectional view of the partially completed transistor device illustrated in FIG. 4 after formation of extension implants within the substrate.

Turning now to FIG. 5, illustrated is a cross-sectional view of the partially completed transistor device 300 illustrated in FIG. 4 after formation of extension implants 510 within the substrate 310. The extension implants 510, which happen to be lightly doped source/drain extension implants in the given embodiment, are conventionally formed and generally have a peak dopant concentration ranging from about 1E19 atoms/cm$^3$ to about 2E20 atoms/cm$^3$. As is standard in the industry, the extension implants 510 have a dopant type opposite to that of the well region 330 they are located within. Accordingly, the extension implants 510 are doped with an n-type dopant in the illustrative embodiment shown in FIG. 5.

Figure 6:
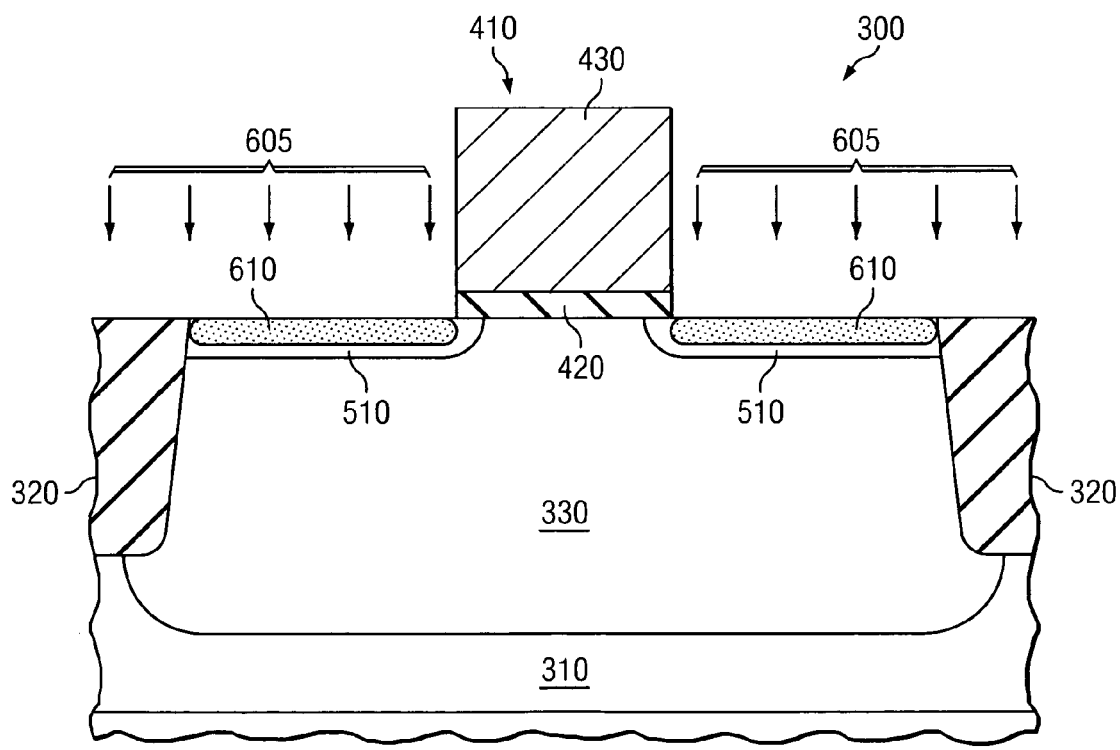
FIG. 6 illustrates a cross-sectional view of the partially completed transistor device illustrated in FIG. 5 after implanting a dislocation loop forming species into the substrate, thereby forming dislocation loops.

Turning now to FIG. 6, illustrated is a cross-sectional view of the partially completed transistor device 300 illustrated in FIG. 5 after implanting a dislocation loop forming species 605 into the substrate 310. The dislocation loop forming species 605, in an exemplary embodiment of the present invention, comprises an inert species, such as nitrogen, argon, etc. Other inert species as well as non-inert species, such as germanium, are also within the scope of the present invention.

Figure 8:
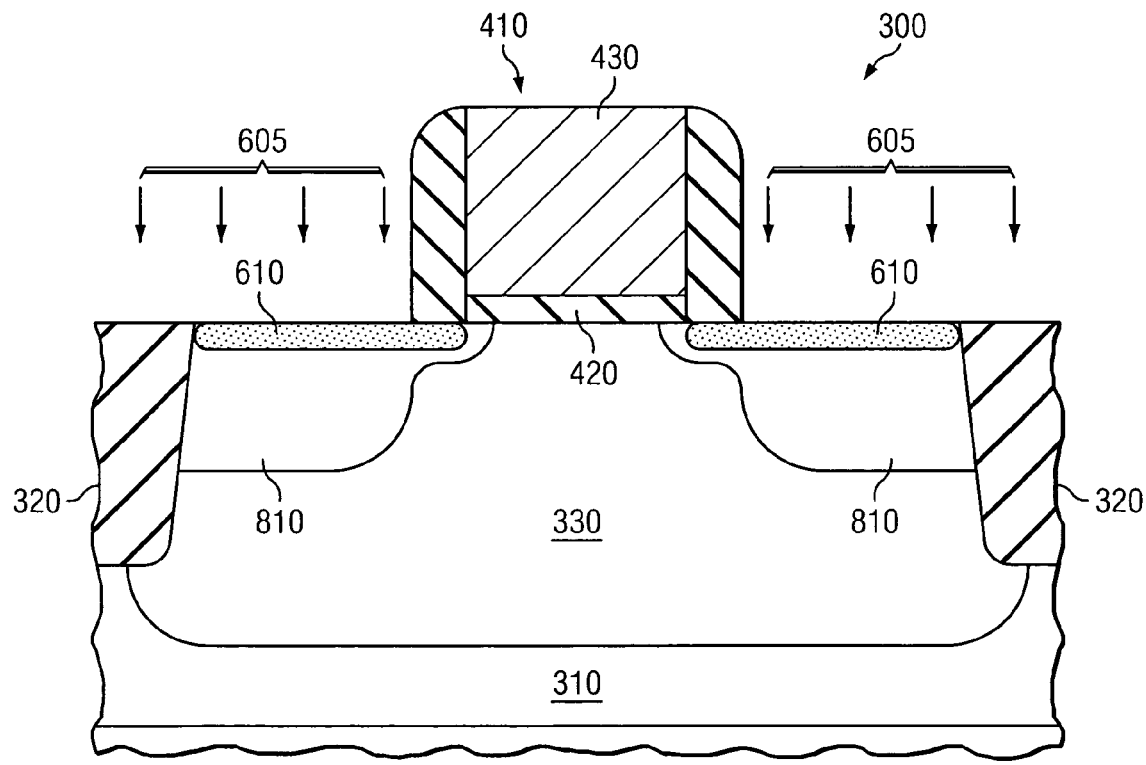
FIG. 8 illustrates a cross-sectional view of the partially completed transistor device illustrated in FIG. 7 after subjecting the source/drain implants to an anneal and thereby forming source/drain regions.

In one advantageous embodiment the dislocation loop forming species 605 are implanted into the substrate 310 using an implant dose ranging from about 1E14 atoms/cm$^2$ to about 9E15 atoms/cm$^2$, with one exemplary dose centering around about 2E15 atoms/cm$^2$. Other doses could nevertheless also be used. Similarly, one advantageous embodiment has the dislocation loop forming species 605 implanted using an energy of about 20 keV or less, with one exemplary power being about 10 keV or less. The energy chosen to implant the dislocation loop forming species 605 must be closely monitored, such that the depth of the implant into the substrate 310 does not extend deeper than the resulting source/drain regions 810 (FIG. 8). In the embodiment of FIG. 6, the energy should be optimized such that the depth of the implant is slightly less than the depth of the extension implants 510.

After implanting the dislocation loop forming species 605 into the substrate 310, the partially completed transistor device 300 may be subjected to an anneal, such as a rapid thermal anneal, to form the dislocation loops 610. In many instance, the annealing of the partially completed transistor device 300 will cause the dislocation loop forming species 605 to completely exit the substrate leaving only the dislocation loops 610. However, certain embodiments, including those using nitrogen as the dislocation loop forming species 605, may allow a portion of the dislocation loop forming species 605 to remain in the substrate 310 proximate the dislocation loops 610. The anneal, as one would expect, may include a variety of different temperatures and times, however, one exemplary embodiment has this anneal conducted at a temperature ranging from about 900° C. to about 1100° C. for a time period ranging from about 0.1 seconds to about 30 seconds.

The resulting dislocation loops 610, as required by the present invention, are formed within a boundary of the source/drain regions 810 (FIG. 8). In the given embodiment shown in FIG. 6, the dislocation loops 610 are formed within a boundary of the extension implant portion 510 of the source/drain regions 810 (FIG. 8). Thus, the depth of the dislocation loops 610 is less than a depth of the extension implants 510. Similarly, the dislocation loops 610 of the embodiment of FIG. 6 are formed to a depth substantially similar to a depth of a channel region formed by the source/drain regions 810 (FIG. 8).

The embodiment discussed and shown with respect to FIGS. 5-6 are based on the idea that the extension implants 510 are formed prior to the formation of the dislocation loops 610. It is apparent, however, that the dislocation loops 610 may easily be formed prior to the formation of the extension implants 510. Care would only need to be taken to protect against forming the dislocation loops 610 deeper than the extension implants 510. Also, switching the order of the formation of the extension implants 510 and dislocation loops 610 is simple, as both the extension implants 510 and dislocation loops 610 are often formed using the same set of masks.

Figure 7:
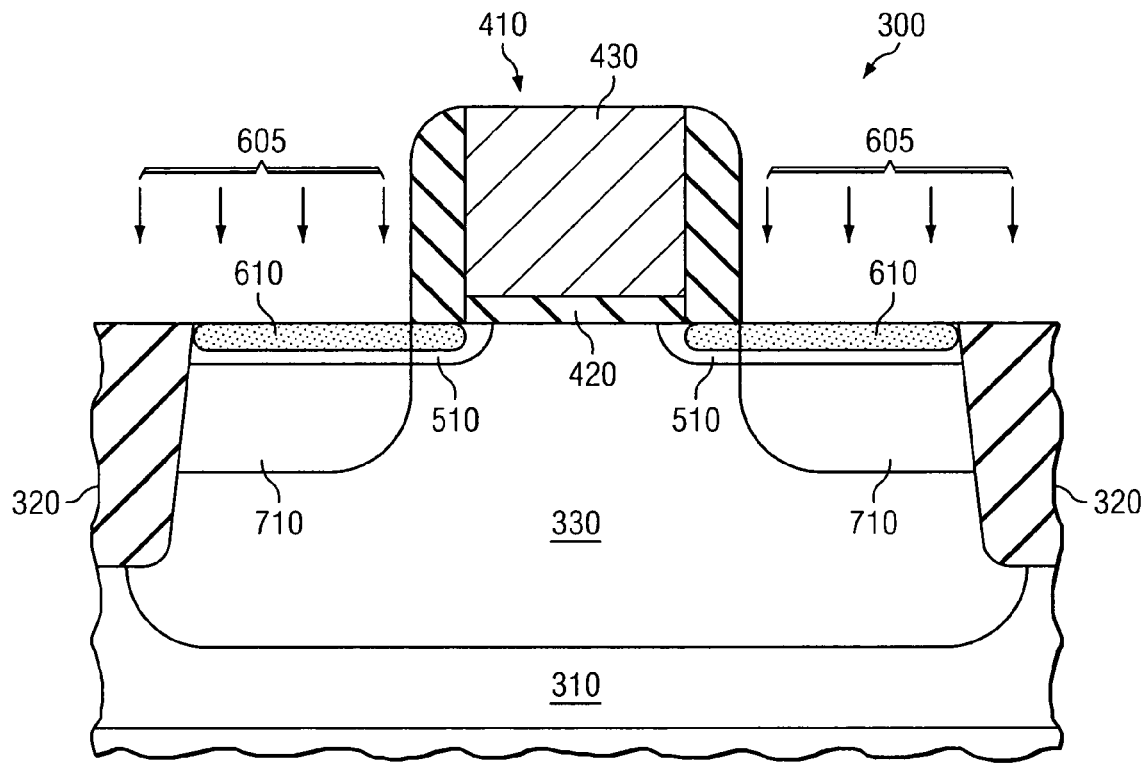
FIG. 7 illustrates a cross-sectional view of the partially completed transistor device illustrated in FIG. 6 after formation of source/drain implants, such as highly doped source/drain implants, within the substrate.

Turning now to FIG. 7, illustrated is a cross-sectional view of the partially completed transistor device 300 illustrated in FIG. 6 after formation of sidewalls on the gate structure 410 and formation of source/drain implants 710, such as heavily doped source/drain implants, proximate the sidewalls within the substrate 310. The source/drain implants 710 are conventionally formed and generally have a peak dopant concentration ranging from about 1E18 atoms/cm$^3$ to about 1E21 atoms/cm$^3$. Also, the source/drain implants 710 should typically have a dopant type opposite to that of the well region 330 they are located within. Accordingly, in the illustrative embodiment shown in FIG. 7, the source/drain implants 710 are doped with an n-type dopant.

Turning now to FIG. 8, illustrated is a cross-sectional view of the partially completed transistor device 300 illustrated in FIG. 7 after subjecting the source/drain implants 710 to an anneal and thereby forming source/drain regions 810. This anneal, as appreciated by those skilled in the art, is designed to activate the source/drain regions 810. While the anneal may be conducted at a number of different temperatures and times, one embodiment of the present invention has this anneal conducted at a temperature ranging from about 950° C. to about 1050° C. for a time period ranging from about 0.1 seconds to about 15 seconds. After forming the source/drain regions 810, the manufacturing process would continue in a conventional manner, ultimately resulting in a device similar to the transistor device 100 illustrated in FIG. 1.

Figure 9:
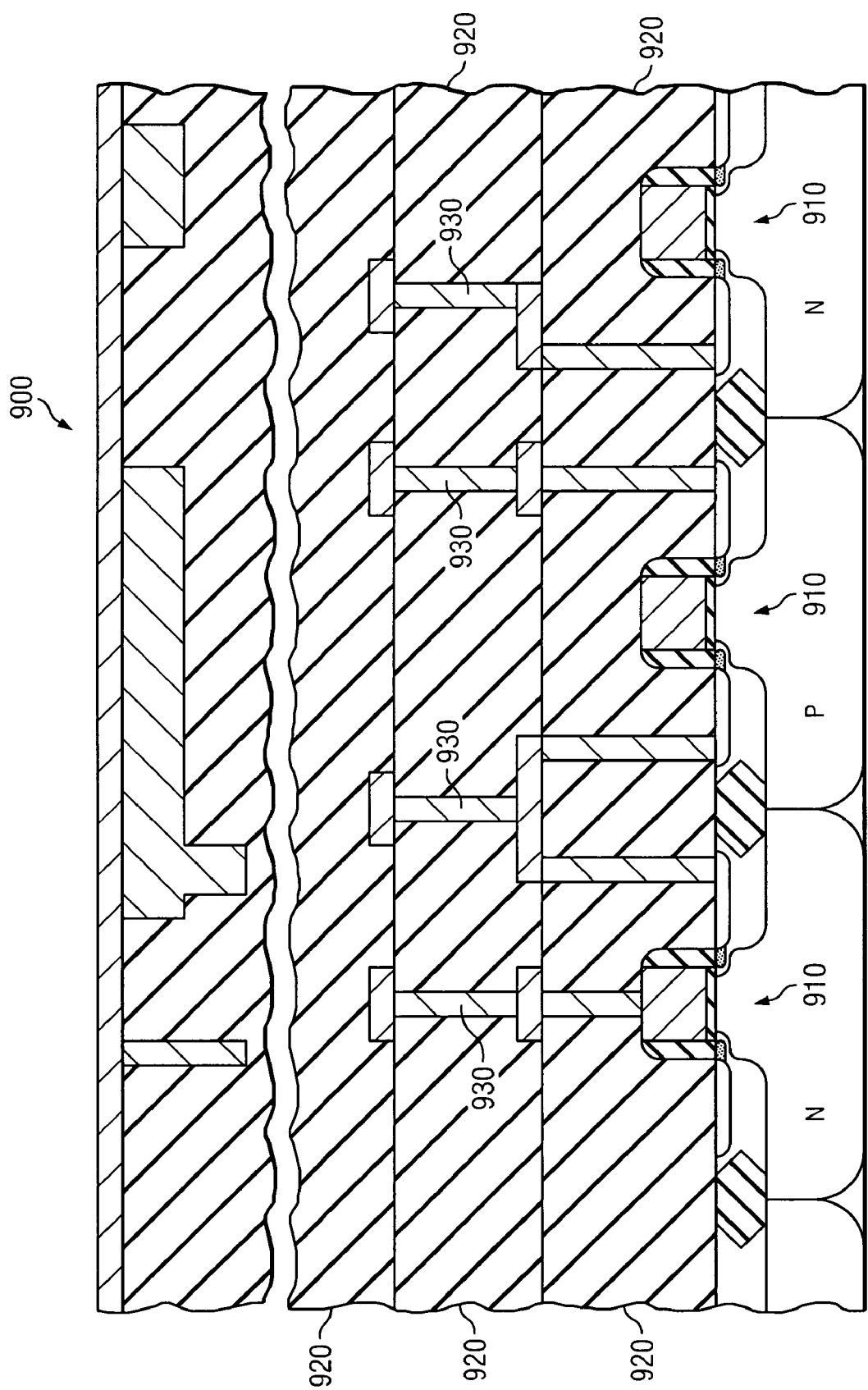
FIG. 9 illustrates a cross-sectional view of a conventional integrated circuit (IC) incorporating transistor devices constructed according to the principles of the present invention.

Referring finally to FIG. 9, illustrated is a cross-sectional view of a conventional integrated circuit (IC) 900 incorporating transistor devices 910 constructed according to the principles of the present invention. The IC 900 may include devices, such as transistors used to form CMOS devices, BiCMOS devices, Bipolar devices, or other types of devices. The IC 900 may further include passive devices, such as inductors or resistors, or it may also include optical devices or optoelectronic devices. Those skilled in the art are familiar with these various types of devices and their manufacture. In the particular embodiment illustrated in FIG. 9, the IC 900 includes the transistor devices 910 having dielectric layers 920 located thereover. Additionally, interconnect structures 930 are located within the dielectric layers 920 to interconnect various devices, thus, forming the operational integrated circuit 900.

Although the present invention has been described in detail, those skilled in the art should understand that they can make various changes, substitutions and alterations herein without departing from the spirit and scope of the invention in its broadest form.

What is claimed is:

1. A method for manufacturing an integrated circuit, comprising:

forming a well region by doping a semiconductor substrate with a given conductivity type dopant;

forming a gate structure over the well region;

forming lightly doped source/drain extension implants by implanting the well region proximate the gate structure with an opposite conductivity type dopant;

implanting a dislocation loop forming species into the lightly doped source/drain extension implants and performing an anneal to form dislocation loops to generate strain in a channel region below the gate structure; the dislocation loop forming species being implanted to a depth less than a depth of the lightly doped source/drain extension implants; and the dislocation loop forming species being implanted using a same mask used to form the lightly doped source/drain extension implants;

forming sidewalls on the gate structure following implanting the dislocation loop forming species; and forming heavily doped source/drain implants by implanting the well region proximate the sidewalls with the opposite conductivity type dopant.

2. The method as recited in claim 1, wherein the dislocation loop forming species comprises nitrogen, a noble gas, or germanium.

3. The method as recited in claim 2, wherein the opposite conductivity type is n-type; and the dislocation loop forming species comprises nitrogen or argon.

4. The method as recited in claim 1, wherein implanting the dislocation loop forming species is implanted using a dose ranging from about 1E14 atoms/cm$^2$ to about 9E15 atoms/cm$^2$.

5. The method as recited in claim 1, wherein the dislocation loop forming species is implanted using an implant energy of about 20 keV or less.

6. The method as recited in claim 5, wherein the dislocation loop forming species is implanted using an implant energy of about 10 keV or less.

7. The method as recited in claim 1, wherein the anneal is performed using a temperature ranging from about 900° C. to about 1000° C.

8. The method as recited in claim 1, wherein the dislocation loops are formed within boundaries of the lightly doped source/drain implants.

9. The method as recited in claim 8, wherein the substrate is annealed using a temperature ranging from about 900° C. to about 1000° C.

10. The method as recited in claim 9, wherein dislocation loop forming species is implanted using a dose ranging from about 1E14 atoms/cm$^2$ to about 9E15 atoms/cm$^2$ and an implant energy of about 20 keV or less.

11. A method for manufacturing an integrated circuit, comprising:

forming a well region of given conductivity type in a semiconductor substrate;

forming a gate structure over the well region;

forming lightly doped source/drain extension implant regions of opposite conductivity type in the well region proximate the gate structure;

forming dislocation loops in the well region by implanting dislocation loop forming species comprising at least one of nitrogen, a noble gas or germanium into the lightly doped source/drain extension implant regions and annealing the substrate; the dislocation loop forming species being implanted to a depth less than a depth of the lightly doped source/drain extension regions and the dislocation loops creating a strain in a channel region below the gate structure;

forming sidewalls on the gate structure following implanting the dislocation loop forming species; and forming heavily doped source/drain implant regions of the opposite conductivity type by implanting the well region proximate the sidewalls.

12. The method as recited in claim 11, wherein the dislocation loop forming species is implanted using a same mask used to form the lightly doped source/drain extension regions.

13. The method as recited in claim 12, wherein the dislocation loops are formed within boundaries of the lightly doped source/drain implant regions.

14. The method as recited in claim 11, wherein the dislocation loops are formed within boundaries of the lightly doped source/drain implant regions.

* * * * *